(12) United States Patent
Choi

(10) Patent No.: US 7,153,742 B2
(45) Date of Patent: Dec. 26, 2006

(54) METHOD FOR FABRICATING FLASH MEMORY DEVICE

(75) Inventor: Tae Ho Choi, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 67 days.

(21) Appl. No.: 11/024,193

(22) Filed: Dec. 29, 2004

(65) Prior Publication Data

US 2005/0139898 A1    Jun. 30, 2005

(30) Foreign Application Priority Data

Dec. 31, 2003    (KR)    .................... 10-2003-0101137

(51) Int. Cl.
H01L 21/336    (2006.01)
H01L 29/788    (2006.01)

(52) U.S. Cl. .................................................. 438/257

(58) Field of Classification Search ................. 438/257
See application file for complete search history.

(56) References Cited

U.S. PATENT DOCUMENTS

| | | | |
|---|---|---|---|
| 5,756,384 A * | 5/1998 | Tseng .......................... | 438/257 |
| 6,130,129 A | 10/2000 | Chen | |
| 6,635,532 B1 | 10/2003 | Song et al. | |
| 6,670,239 B1 * | 12/2003 | Yoon .......................... | 438/257 |
| 6,768,681 B1 | 7/2004 | Kim | |
| 2003/0080373 A1 * | 5/2003 | Lee .............................. | 257/316 |
| 2003/0219944 A1 * | 11/2003 | Kato et al. ................... | 438/257 |

* cited by examiner

Primary Examiner—W. David Coleman
(74) Attorney, Agent, or Firm—Finnegan, Henderson, Farabow, Garrett & Dunner, L.L.P.

(57) ABSTRACT

A flash memory device fabrication method is disclosed. A disclosed method comprises: forming an oxide layer on a substrate; depositing a first polysilicon on the entire surface of the oxide layer and patterning the first polysilicon; depositing an insulating layer on the entire surface of the first polysilicon and patterning the insulating layer to expose the first polysilicon; depositing a second polysilicon on the entire surface of the resulting structure and patterning the second polysilicon; removing the insulating layer; depositing a dielectric layer on the entire surface of the resulting structure; and depositing a third polysilicon on the entire surface of the dielectric layer.

6 Claims, 3 Drawing Sheets

METHOD FOR FABRICATING FLASH MEMORY DEVICE

FIELD OF THE INVENTION

The present disclosure relates to a flash memory device and, more particularly, to a method for increasing a coupling ratio by enlarging the area between a floating gate and a control gate.

BACKGROUND

Generally, semiconductor memory devices are divided into volatile memories and nonvolatile memories. The volatile memories, including chiefly random access memories (RAM) such as dynamic random access memories (DRAM) and static random access memories (SRM), retain their memory data when power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structure and split gate structure are widely applied to flash EEPROM. The split gate structure comprises two transistors in one cell. On the other hand, the memory devices of the MIS family perform memory functions by using traps positioned on a bulk dielectric, the interface between dielectrics, and the interface between the dielectric and the semiconductor. At present, the MONOS (metal oxide nitride oxide semiconductor)/SONOS (semiconductor oxide nitride oxide semiconductor) structure is chiefly being employed for the flash EEPROM.

FIG. 1 is a cross-sectional view of a flash memory cell structure formed by a conventional technology. Referring to FIG. 1, a gate oxide layer 12 is deposited on a semiconductor substrate 10 having at least one device isolation layer 11. A first polysilicon layer 13 is deposited on the gate oxide layer 12. The first polysilicon layer 13 is used as a floating gate. A dielectric layer 15 and a second polysilicon layer 16 are sequentially deposited on the first polysilicon layer 13. The second polysilicon layer 16 is used as a control gate. A metal layer 17 and a nitride layer 18 are sequentially deposited on the second polysilicon layer 16. Next, some portion of the gate oxide layer 12, the first polysilicon layer 13, the dielectric layer 15, the second polysilicon layer 16, the metal layer 17, and the nitride layer 18 are removed in cell structure to complete a flash memory cell.

The above-mentioned flash memory cell has a floating gate and a control gate of flat-plate type. Generally, in a flash memory, electric potential of a control gate has to be thoroughly transferred into a floating gate to enhance the erase and program characteristics of a device. For example, when a flash memory performs the program function using hot carriers, the voltages of 0 V, 5 V, and 9V are applied to a source, a drain, and a control gate, respectively. Here, if the voltage applied to the control gate is thoroughly transferred to a gate oxide via a floating gate and forms an electric field, hot electrons are more rapidly injected into the floating gate. Contrarily, when the flash memory performs the erase function, the voltages of −7 V and 5 V are applied to the control gate and the source, respectively. In this case, electrons in the floating gate move toward the source by Fowler-Nordheim (F-N) tunneling. Here, if the capacitance between the control gate and the floating gate is high and the capacitance between the floating gate and a substrate is low, the voltage of the floating gate is maintained at a very low value and, therefore, the more electrons move toward the source to increase the erase speed. In conclusion, in performing the program or erase function, the smaller the voltage difference between the floating gate and the control gate becomes, the faster the operation speed of the flash memory becomes.

To improve the program and erase characteristics of a semiconductor device, a method of using a material with high dielectric constant as a dielectric layer between the floating gate and the control gate has been suggested. However, the suggested method is in progress at present and requires more technical development.

In order to improve the program and erase characteristics of a semiconductor device, other methods of increasing the capacitance by enlarging the surface area between the control gate and the floating gate are put to practical use. For example, an OSC (One Cylinder Storage) structure or a DCS (Double Cylinder Storage) structure is employed to increase the capacitance of capacitors. However, such prior arts require complicated fabrication processes and have a difficulty in maintaining constant capacitance as the level of integration degrees changes. In addition, as the floating gate is three-dimensionally completed, the large surface area between the floating gate and the substrate may degrade the program and erase characteristics of a semiconductor device. Thus, a method for fabricating a structure is required which can increase the area between the control gate and the floating gate without changing the area between the floating gate and the substrate.

SUMMARY OF THE INVENTION

Accordingly, the present invention is directed to a flash memory device fabrication method that substantially obviates one or more problems due to limitations and disadvantages of the related art.

An object of the present invention is to provide a flash memory device which improves erase and program characteristics by increasing a coupling ratio through enlarging the area between a floating gate and a control gate.

To achieve these objects and other advantages and in accordance with the purpose of the invention, as embodied and broadly described herein, the present invention provides a method of fabricating a flash memory device comprising: forming an oxide layer on a substrate; depositing a first polysilicon on the entire surface of the oxide layer and patterning the first polysilicon; depositing an insulating layer on the entire surface of the first polysilicon and patterning the insulating layer to expose the first polysilicon; depositing a second polysilicon on the entire surface of the resulting structure and patterning the second polysilicon; removing the insulating layer; depositing a dielectric layer on the entire surface of the resulting structure; and depositing a third polysilicon on the entire surface of the dielectric layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

FIGS. 2a through 2d are cross-sectional views illustrating an example method for fabricating a flash memory device in accordance with the present invention.

Figure 1:
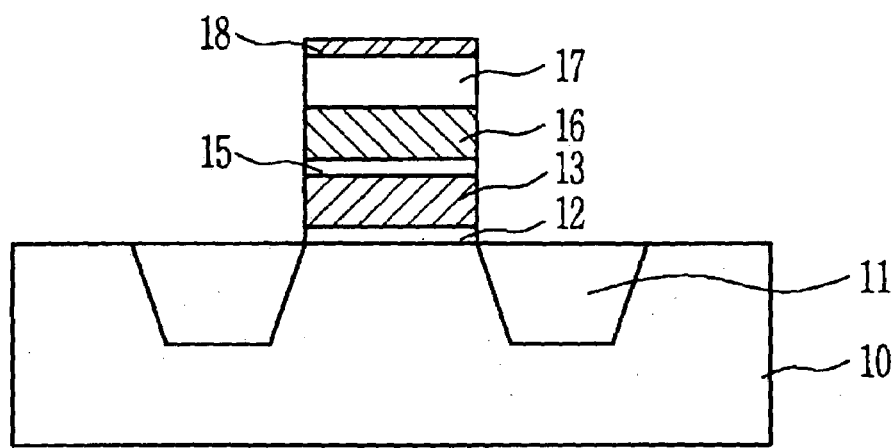
FIG. 1 is a cross-sectional view of a flash memory cell structure formed by a conventional technology.
Figure 2A:
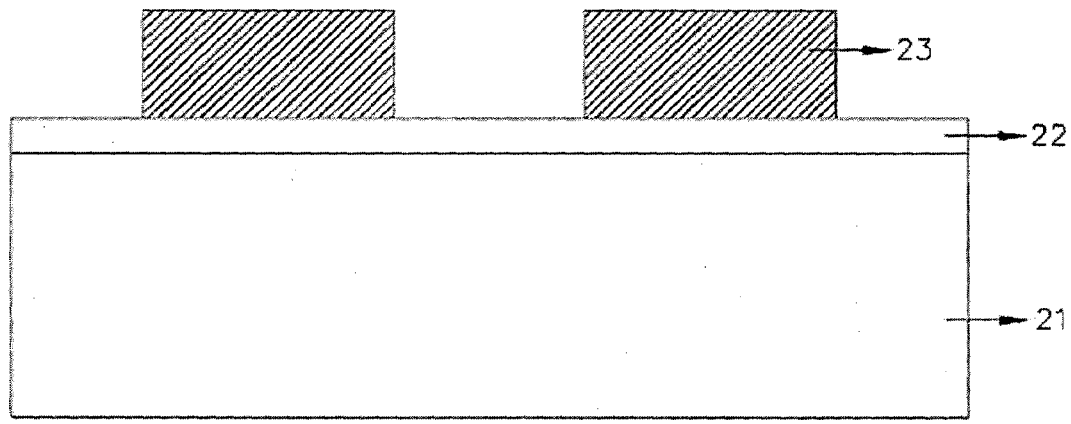
FIGS. 2a through 2d are cross-sectional views illustrating an example method for fabricating a flash memory device in accordance with the present invention.

Referring to FIG. 2a, an oxide layer 22 is formed on a silicon substrate 21. The oxide layer 22 is used as a tunnel oxide layer with a thickness between 50 nm and 100 nm. Subsequently, a first polysilicon 23 for floating gates is deposited on the gate oxide layer 22. After a photoresist pattern (not shown) is formed on the first polysilicon 23 by a common photolithography process, the predetermined portion of the polysilicon 23 is removed with the photoresist pattern as an etching mask. Next, the photoreist pattern is removed.

Figure 2B:
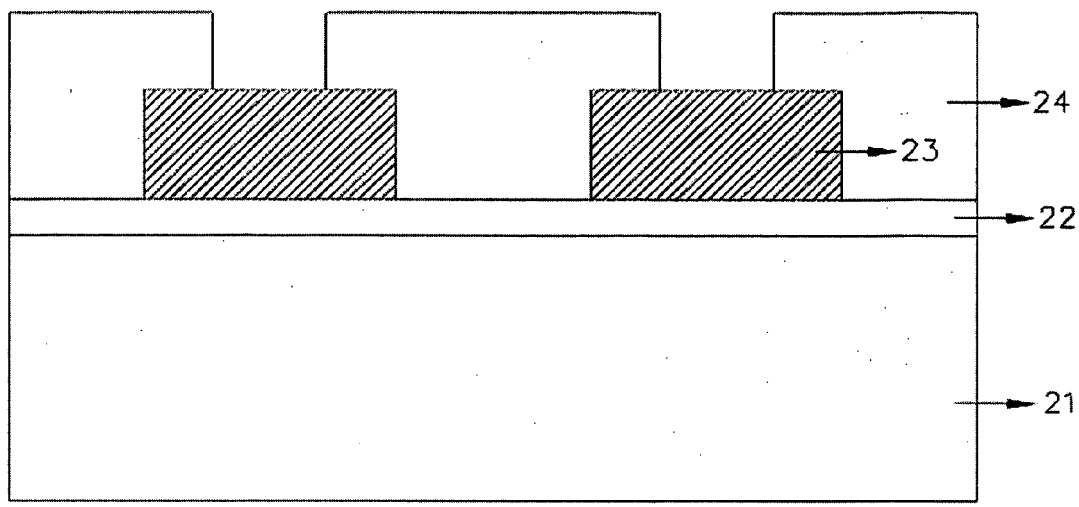

Referring to FIG. 2b, an insulating layer 24 is formed on the entire surface of the resulting structure. After a photoresist pattern (not shown) is formed on the insulating layer 24 by a photolithography process, the insulating layer 24 is patterned to expose the first polysilicon 23 with the photoresist pattern as a mask and the photoresist pattern is then removed. Preferably, the insulating layer 24 is made of nitride.

Figure 2C:
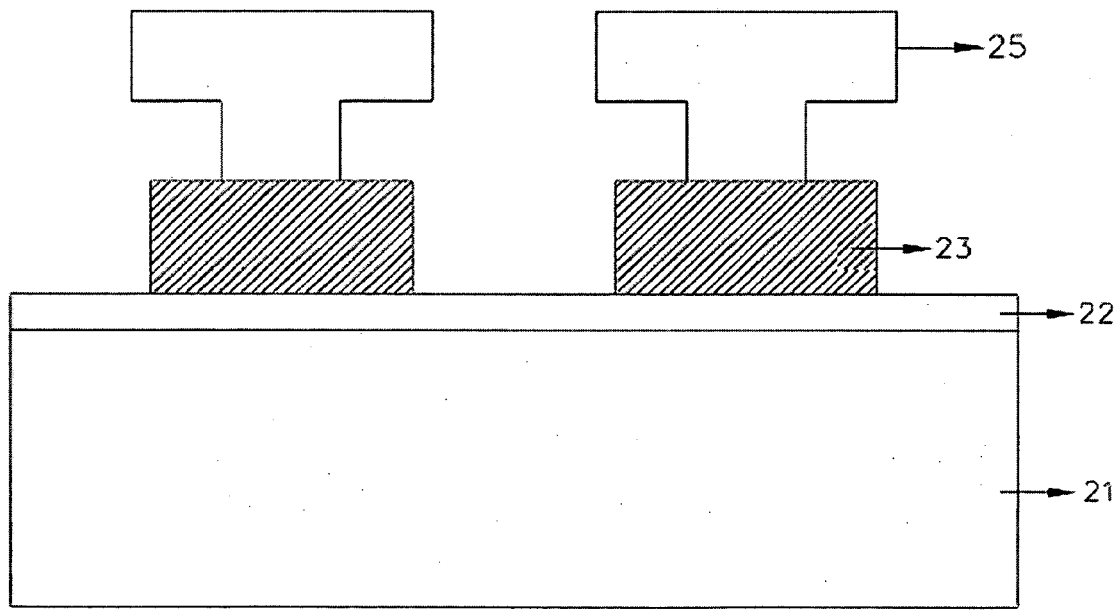

Referring to FIG. 2c, a second polysilicon 25 for the floating gates is deposited on the entire surface of the substrate. The second polysilicon 25 is in contact with the exposed area of the first polysilicon 23. After a photoresist pattern (not shown) is formed on the second polysilicon by a well-known photolithography process, the second polysilicon is patterned with the photoresist pattern as a mask. A reticle which is used to pattern the photoresist pattern in this step is identical to the reticle which has been used to pattern the first polysilicon. Subsequently, residues on the resulting structure is removed by a wet etch.

Figure 2D:
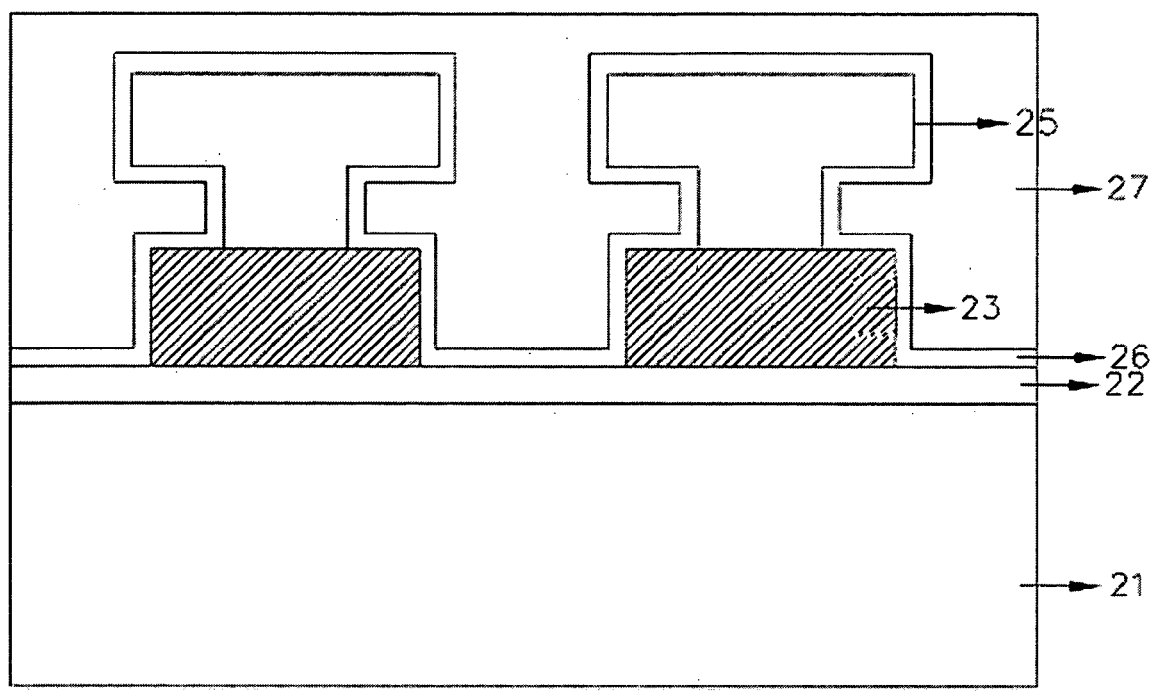

Referring to FIG. 2d, a dielectric layer 26 is deposited on the entire surface of the resulting structure. A third polysilicon 27 for a control gate is then deposited on the entire surface of the dielectric layer 26. Preferably, the dielectric layer 26 is an ONO (Oxide-Nitride-Oxide) layer or an oxide layer. Thus, the flash memory device in accordance with the present invention is constructed as follows. An oxide layer is poisoned on a substrate. Polysilicon for a floating gate is placed on the oxide layer, wherein the floating gate is dumbell shaped, which means that the upper and the bottom part of the floating gate are wider than the middle part. A dielectric layer is placed on the entire surface of the floating gate. Finally, a third polysilicon for a control gate is positioned on the dielectric layer.

Accordingly, the present invention provides a method for increasing a coupling ratio by enlarging the area between the floating gate and the control gate, thereby increasing the coupling ratio and improving an efficiency of erase and program operations.

It is noted that this patent claims priority from Korean Patent Application Number 10-2003-0101137, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacturing fairly falling within the scope of the appended claims either literally or under the doctrine of equivalents.

What is claimed is:

1. A method of fabricating a flash memory device comprising:
    forming an oxide layer on a substrate;
    depositing a first polysilicon on the entire surface of the oxide layer and patterning the first polysilicon;
    depositing an insulating layer on the entire surface of the first polysilicon and patterning the insulating layer to expose the first polysilicon;
    depositing a second polysilicon on the entire surface of the resulting structure and patterning the second polysilicon;
    removing the insulating layer;
    depositing a dielectric layer on the entire surface of the resulting structure; and
    depositing a third polysilicon on the entire surface of the dielectric layer.

2. A method as defined in claim 1, wherein the first polysilicon is in contact with the second polysilicon, thereby forming floating gates.

3. A method as defined in claim 1, wherein the insulating layer is made of nitride.

4. A method as defined in claim 1, wherein the insulating layer is removed by a wet etch.

5. A method as defined in claim 1, wherein the dielectric layer is an ONO layer or an oxide layer.

6. A method as defined in claim 1, wherein the second polysilicon is patterned with same raticle as used in patterning the first polysilicon.

* * * * *